(12) United States Patent
Kim et al.

(10) Patent No.: US 7,061,955 B2
(45) Date of Patent: Jun. 13, 2006

(54) HETEROGENEOUS COMPOSITE SEMICONDUCTOR STRUCTURES FOR ENHANCED OXIDE AND AIR APERTURE FORMATION FOR SEMICONDUCTOR LASERS AND DETECTORS AND METHOD OF MANUFACTURE

(75) Inventors: Jin Kwang Kim, St. Louis Park, MN (US); Andrew Sumika Huntington, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/953,576

(22) Filed: Sep. 14, 2001

(65) Prior Publication Data

US 2002/0071471 A1 Jun. 13, 2002

Related U.S. Application Data

(60) Provisional application No. 60/233,013, filed on Sep. 15, 2000.

(51) Int. Cl.
*H01S 5/00* (2006.01)
(52) U.S. Cl. ............................ 372/46.013; 372/46.014
(58) Field of Classification Search ................ 372/96, 372/45–46, 46.013, 46.014
See application file for complete search history.

(56) References Cited

U.S. PATENT DOCUMENTS 3,833,435 A * 9/1974 Logan et al. ................. 438/31
5,712,865 A * 1/1998 Chow et al. .................. 372/96
5,991,326 A * 11/1999 Yuen et al. .................... 372/96
6,075,804 A * 6/2000 Deppe et al. ................. 372/96
6,472,695 B1 * 10/2002 Hall et al. .................... 257/190
6,668,005 B1 * 12/2003 Streubel .......................... 372/96
2002/0067748 A1* 6/2002 Coldren et al. ............... 372/43

FOREIGN PATENT DOCUMENTS

JP 2000-12459 * 4/2000

OTHER PUBLICATIONS

Iwai et al., "High Performance 1.3-um InAsP Strained-Layer Quantum-Well ACIS (Al-Oxide Confined Inner Stripe) Lasers," IEE Journal of Selected Topics in Quantum Electronics, vol. 5, No. 3, May/Jun. 1999, pp. 694-700.*
Naone et al., "Oxidation of AlGaAs Layers for Tapered Apertures in Vertical-Cavity Lasers," Electronics Letters, vol. 33, No. 4, Feb. 1997, pp. 300-301.*

* cited by examiner

*Primary Examiner*—James Menefee
(74) *Attorney, Agent, or Firm*—DLA Piper Rudnick Gray Cary US LLP

(57) ABSTRACT

The present invention creates oxide and air apertures in material systems, such as InP, that do not usually accommodate epitaxial incorporation of highly oxidizing materials, such as AlAs, of sufficient thickness to adequately provide optical as well as current aperturing. A composite structure of relatively slowly oxidizing layer or layers (e.g. AlInAs on InP) with a faster-oxidizing layer or layers (e.g. AlAs on InP) can be used to produce oxide and air apertures of various shapes and sizes, and to also increase the oxidation rate.

16 Claims, 4 Drawing Sheets

HETEROGENEOUS COMPOSITE SEMICONDUCTOR STRUCTURES FOR ENHANCED OXIDE AND AIR APERTURE FORMATION FOR SEMICONDUCTOR LASERS AND DETECTORS AND METHOD OF MANUFACTURE

The present application claims priority to U.S. Provisional Application Ser. No. 60/233,013, filed Sep. 15, 2000, which is hereby incorporated by reference in its entirety into the present disclosure.

This invention was made with the support of the United States Government under Grant No. MDA972-98-1-0001, awarded by the Department of Defense (DARPA). The Government has certain rights in this invention under 35 U.S.C. §202.

BACKGROUND OF THE INVENTION

1. Field of the Invention

This invention is directed to apertures in semiconductors and more particularly to heterogeneous composite semiconductor structures for enhanced oxide and air aperture formation for semiconductor lasers and detectors and their method of manufacture.

2. General Background and State of the Art

Oxide and air apertures can enhance the performance of semiconductor lasers and detectors. However, such apertures are difficult to implement in material systems that do not accommodate epitaxial incorporation of highly oxidizing materials of sufficient thickness. For example, the oxide aperture technology has found wide use in devices made in the AlGaAs system, but not so for devices made on indium phosphide (InP) because lattice-matched materials on InP do not oxidize fast enough at temperatures not damaging to the material (except for AlAsSb which is unsuitable because it decomposes into metallic Sb as it oxidizes). Fast-oxidizing materials (e.g. AlAs) may be grown on InP in limited thickness, but such thin layers oxidize too slowly and are of a limited use as optical apertures due to the limited thickness.

The prior art shows several attempts at implementing apertures on InP. In one previous implementation (see Zhi-Jie Wang; Soo-Jin Chua; Zi-Ying Zhang; Fan Zhou; Jing-Yuan Zhang; Xiao-Jie Wang; Wei Wang; Hong-Liang Zhu. "Self-aligned current aperture in native oxidized AlInAs buried heterostructure InGaAsP/InP distributed feedback laser," Applied Physics Letters, vol. 76, (no. 12), AIP, 20 Mar. 2000. p. 1492–4) AlInAs is used as the oxidation layer. AlInAs typically suffers from low oxidation rates, unless cladded by InP as it has been in this implementation. However, such oxidation layers suffer from rough oxide-semiconductor interface, and thus are unsuitable for optoelectronic device applications.

In another implementation (see Yen, J. C.; Blank, H.-R.; Mishra, U.K. "Lateral oxide current aperture for InP-based vertical electron current flow devices: Demonstration using RTD's," Proceedings IEEE/Cornell Conference on Advanced Concepts in High Speed Semiconductor Devices and Circuits, Ithaca, N.Y., USA, 4–6 Aug. 1997) AlAsSb is used as the oxidation layer. AlAsSb is unsuitable for most optoelectronic and many electronic device applications because it leaves a layer of metallic Sb as it oxidizes.

In an additional implementation of the prior art (see Ohnoki, N.; Koyama, F.; Iga, K. "Superlattice AlAs/AlInAs-oxide current aperture for long wavelength InP-based vertical-cavity surface-emitting laser structure," Applied Physics Letters, vol. 73, (no. 22), AIP, 30 Nov. 1998. p. 3262–4) thin layers of heavily-strained AlAs on InP are used. However, the layers described in this reference are extremely difficult to epitaxially grow without a significant amount of dislocations and thus, undesirable for most optoelectronic applications.

It is a goal of the present invention to create apertures in material systems, such as InP, that do not usually accommodate epitaxial incorporation of highly oxidizing materials, such as AlAs, of sufficient thickness to adequately provide optical as well as current aperturing. A further goal of this invention includes the creation of various types of apertures, including tapered apertures, of nearly arbitrary thickness and length.

INVENTION SUMMARY

The present invention creates oxide and air apertures in material systems, such as InP, that do not usually accommodate epitaxial incorporation of highly oxidizing materials, such as AlAs, of sufficient thickness to adequately provide optical as well as current aperturing. A composite structure of relatively slowly oxidizing layer or layers (e.g. AlInAs on InP) with a faster-oxidizing layer or layers (e.g. AlAs on InP) can be used to produce oxide and air apertures of various shapes and sizes, and to also increase the oxidation rate.

The semiconductor structure of the present invention is comprised of multiple layers of various composition, strain, and thickness, which oxidize together to form an oxide aperture or etch to form an air aperture. Because each individual layer oxidizes or etches at a different rate, the shape and size of the resulting oxide or air aperture can be independently controlled by controlling the individual layer composition and thickness.

The method for forming apertures in a semiconductor of the present invention comprises the steps of depositing multiple layers of various composition, strain, and thickness and oxidizing in an oxidizing ambient or etching in a selective etchant.

BRIEF DESCRIPTION OF THE DRAWINGS

The following invention will become better understood with reference to the specification, appended claims, and accompanying drawings, where:

DETAILED DESCRIPTION OF THE PREFERRED EMBODIMENTS

Figure 1:
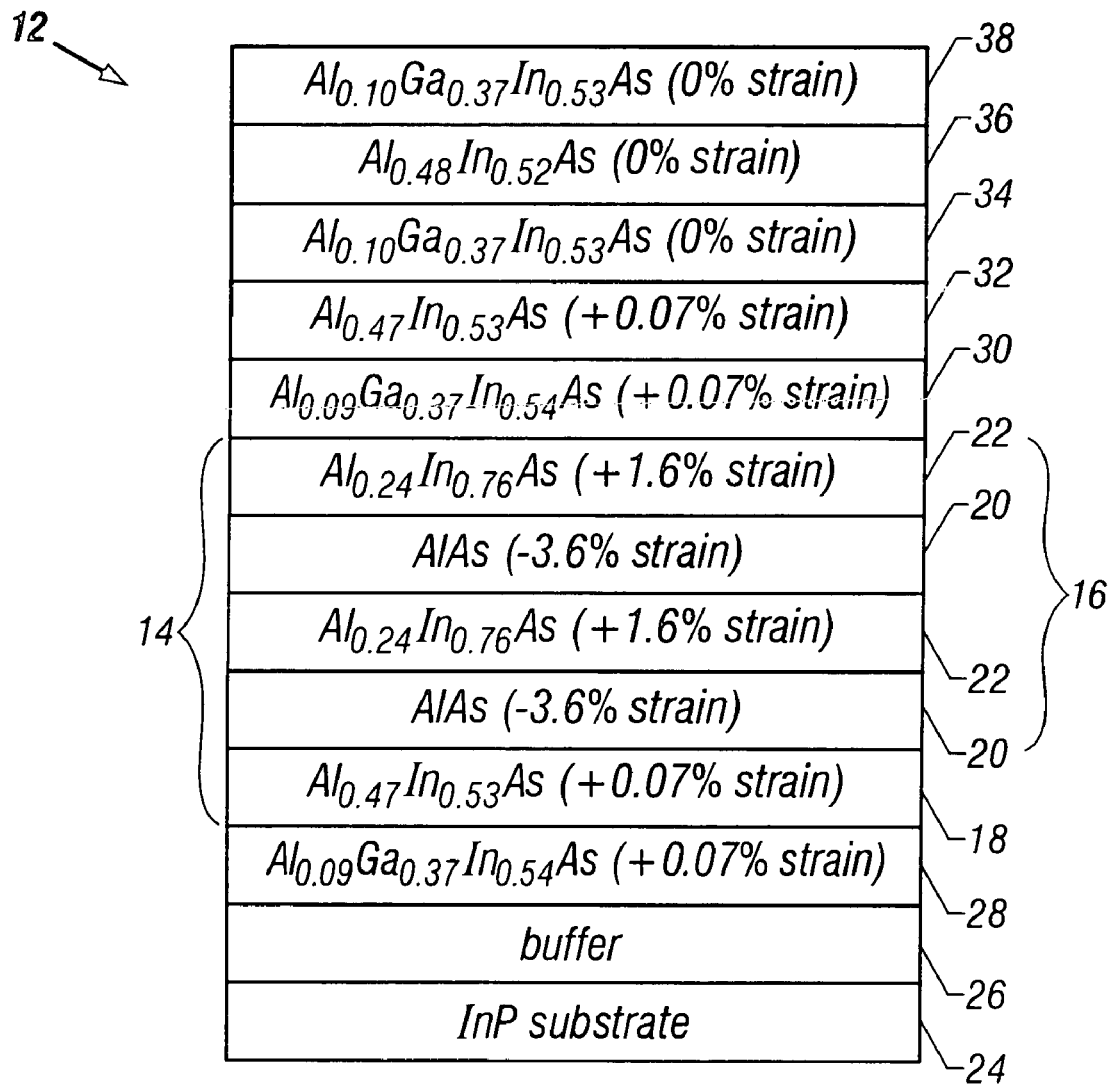
FIG. 1 is a diagrammatic representation, not to scale, of an example composite semiconductor structure of the present invention.

FIG. 1 is a diagrammatic representation, not to scale, of an example composite semiconductor structure 12 of the present invention. The composite semiconductor structure 12 includes a heterogeneous composite structure 14 from which an aperture is formed. The heterogeneous composite structure 14 is composed of yet another composite structure 16, which is a combination of faster-oxidizing AlAs layers 20 and strain-reducing AlInAs layers 22 and a layer of more slowly-oxidizing material 18. This combination 14 increases the overall oxidation rate and the oxide thickness.

In one embodiment the layer of more slowly-oxidizing material 18 is composed of 108 nm thick (approximately quarter wavelength) $Al_{0.47}In_{0.53}As$ strained to +0.07%. The layer of faster-oxidizing heterogeneous semiconductor material 16 can be composed mainly of AlAs. In another embodiment, the layer of fast-oxidizing heterogeneous semiconductor material 16 is a composite of several materials. As illustrated in FIG. 1, the layer of faster-oxidizing heterogeneous semiconductor material 16 is formed from two 5 nm thick layers 20 of AlAs tensile strained to −3.6% adjacent to two layers of 1 nm thick layers 22 of $Al_{0.24}In_{0.76}As$ strained to +1.6%.

The 1 nm thick layers 22 of $Al_{0.24}In_{0.76}As$ increase the total amount of the layers of faster-oxidizing AlAs 20 that can be used in the structure 12. They also serve to reduce the strain of the structure 12.

In other embodiments the heterogeneous composite structure 14 is composed of multiple layers of the fast-oxidizing heterogeneous semiconductor material 16 placed adjacent to one or multiple layers of the more slowly-oxidizing material 18.

The heterogeneous composite structure 14 can be formed upon an InP substrate 24, buffer layer 26 and a layer 28 of 112 nm thick $Al_{0.09}Ga_{0.37}In_{0.54}As$ strained slightly compressively to +0.07%. On the opposite surface of heterogeneous composite structure 14 can be another layer 30 of 112 nm thick $Al_{0.09}Ga_{0.37}In_{0.54}As$ strained slightly compressively to +0.07%, so that the heterogeneous composite structure 14 is sandwiched between two layers 28, 30 of 112 nm thick (approximately quarter wavelength) $Al_{0.09}Ga_{0.37}In_{0.54}As$ strained slightly compressively to +0.07%. Adjacent the layer 30 is a layer 32 of 120 nm thick $Al_{0.47}In_{0.53}As$ having a +0.07% strain followed by a layer 34 of 112 nm $Al_{0.10}Ga_{0.37}In_{0.53}As$ having 0% strain and a layer 36 of 120 nm thick $Al_{0.48}In_{0.52}As$ lattice matched to InP and having 0% strain. Finally a layer 38 of 112 nm thick $Al_{0.10}Ga_{0.37}In_{0.53}As$ having 0% strain is shown.

The heterogeneous composite structure 14 is not limited to formation upon InP material systems. The heterogeneous composite structure 14 is useful for forming oxide and/or air apertures of sufficient thickness on other substrates and/or in other material systems in which apertures of sufficient thickness and/or length cannot be formed from a single oxidation layer or a single etch-out layer.

The layers forming the heterogeneous composite structure 14 can be oxidized to form an oxide aperture. Alternatively, rather than oxidizing the structure, or prior to oxidizing the structure, the semiconductor material of the structure 14 can be selectively chemically etched out to form an air aperture. Etching is chemically related to the oxidation process so that some etchants preferentially etch those materials that oxidize well. The structure 14 can also be oxidized and then the oxide selectively etched out to form an air aperture. The air apertures formed in such a manner have increased effectiveness both as optical apertures (due to increased index contrast) and as currents aperture (due to increased resistivity through or around the air gap).

The slowly oxidizing layer 18 is not as limited in thickness as are the fast-oxidizing layers 20, and thus, the thickness of the oxide apertures formed from such heterogeneous composite structures may be arbitrarily controlled. Furthermore, both the shape and size of the oxide aperture may be tailored to maximize its effectiveness as an optical aperture (as well as a current aperture) by changing the compositions and thickness of individual layers and thereby controlling the oxidation rates of the individual layers. Such techniques can be used to form tapered oxide apertures, which have the advantage of being able to control the extent of the optical aperturing and that of the current aperturing independently. Prior to the present invention, such tapered apertures had not been implemented in any system other than AlGaAs on GaAs.

Figure 2A:
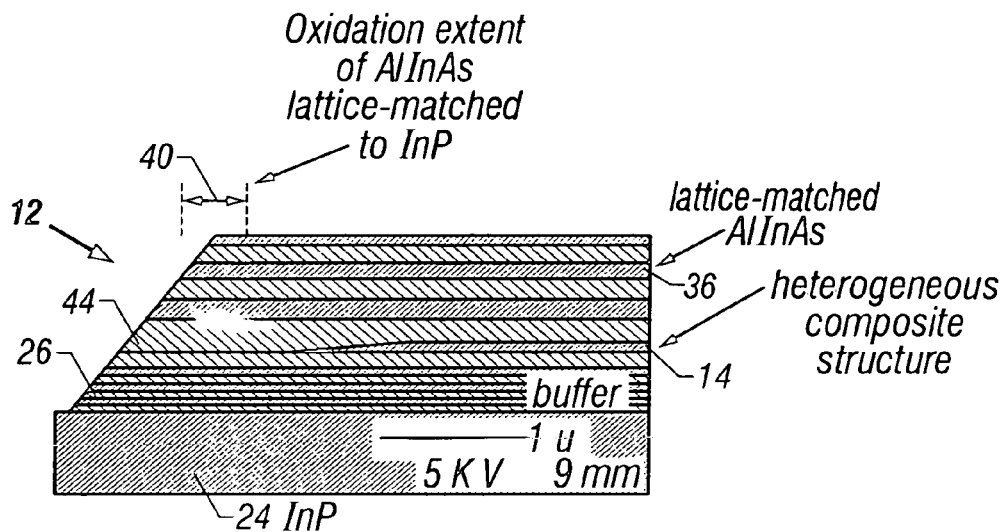
FIG. 2(A) is a depiction of a SEM of the composite semiconductor structure of FIG. 1.
Figure 2B:
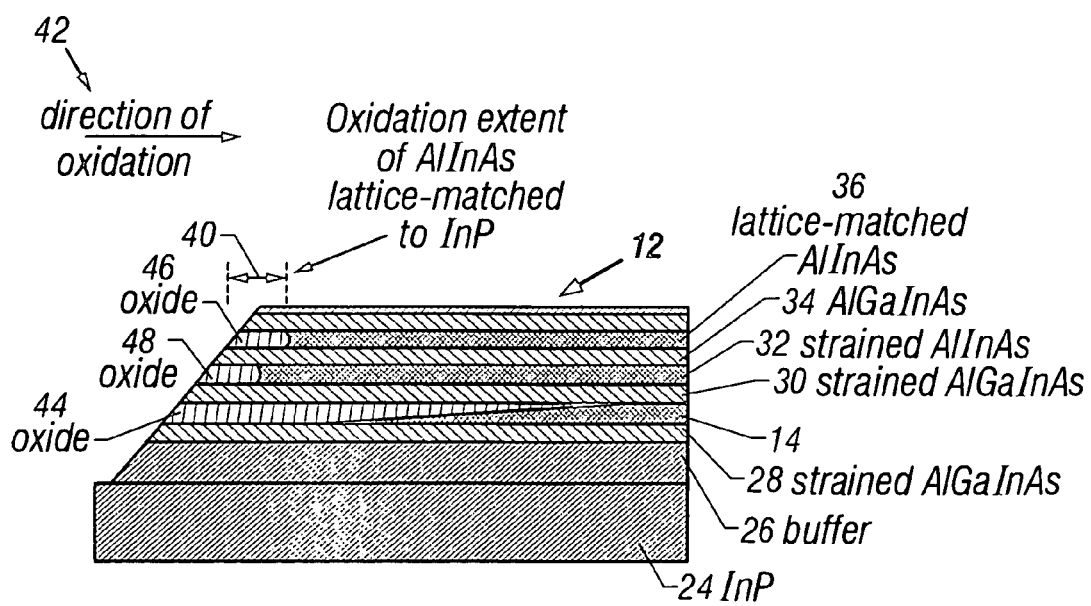
FIG. 2(B) is a is a diagrammatic view of the SEM depiction of FIG. 2.

FIG. 2(a) is a depiction of a SEM of the composite semiconductor structure 12 corresponding to the diagrammatic representation of FIG. 1 and FIG. 2(b) is a diagrammatic view of the SEM depiction. A tapered oxide aperture 44 is shown within the heterogeneous composite structure 14 in FIG. 2(a) and more clearly in FIG. 2(b). The composite semiconductor structure 12 is shown having been etched through the structure to form a pillar perpendicular to the surface. In this illustrated embodiment, the sample is oxidized for 1 hour at 500 degrees C. in a steam ambient at atmospheric pressure. Other oxidation methods can be used as well, however. The oxidation proceeds much more rapidly through the faster-oxidizing heterogeneous semiconductor material 16 than it does through the more slowly-oxidizing material 18, resulting in the tapering. The direction of the oxidation in both FIGS. 2(a) and 2(b) is indicated by the arrow 42. The layer 32 of 120 nm thick $Al_{0.47}In_{0.53}As$ and the layer 36 of 120 nm thick $Al_{0.48}In_{0.52}As$ lattice matched to InP are also oxidized. The layer 36 is shown oxidized a distance 40. The tapered oxide aperture 44 is oxidized to a distance of approximately 2 micrometers into the etched pillar, which is more than a factor of five greater than is possible with lattice-matched AlInAs 46 under the same conditions.

The thickness of the AlAs layers 20 may be modified to change the shape and oxidation rate of the composite aperture 14. In addition, the AlInAs layers cladding the AlAs layers on both sides can be used to alter the shape, size and oxidation rate. Finally, the oxide may be etched out using a selective etchant such as KOH.

Figure 3A:
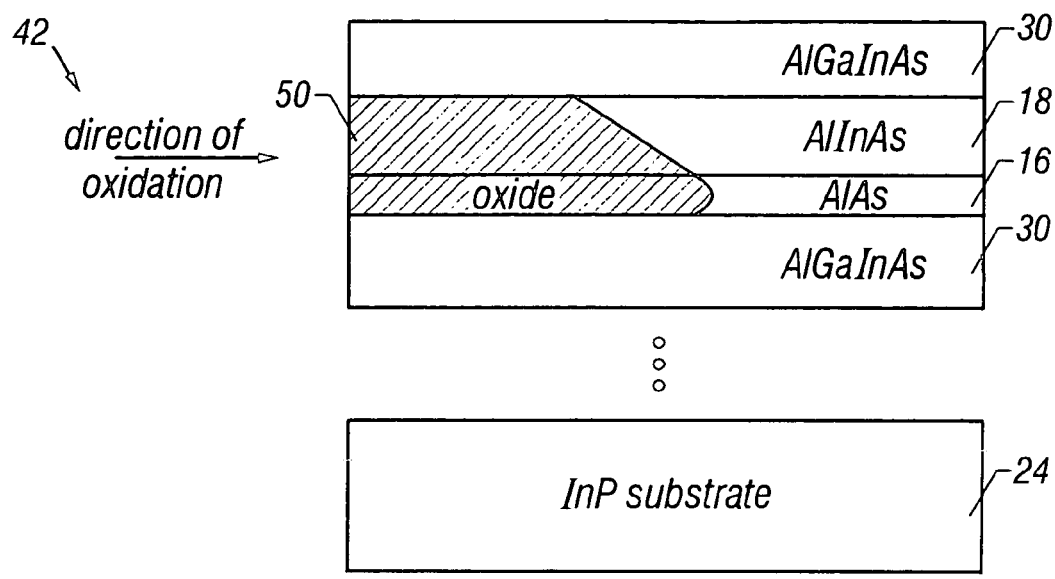
FIGS. 3(A) and 3(B) illustrate an embodiment in which a faster-oxidizing layer is clad a the slower-oxidizing layer.
Figure 3B:
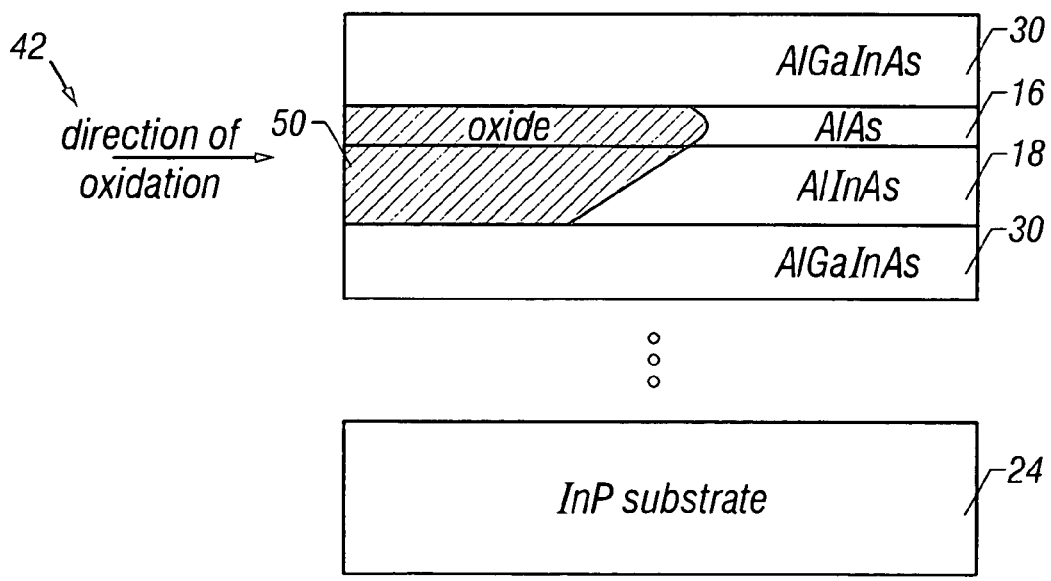

FIGS. 3(a) and 3(b) illustrate an embodiment in which the faster-oxidizing layer 16, such as AlAs, is clad with the slower-oxidizing layer 18, such as AlInAs. As shown, this embodiment can increase the overall thickness of the aperture, increase the oxidation rate, while implementing an asymmetric tapered aperture 50. The specific relative thicknesses serve only as an example and the usefulness of the invention is not limited to the thicknesses as illustrated.

Figure 4:
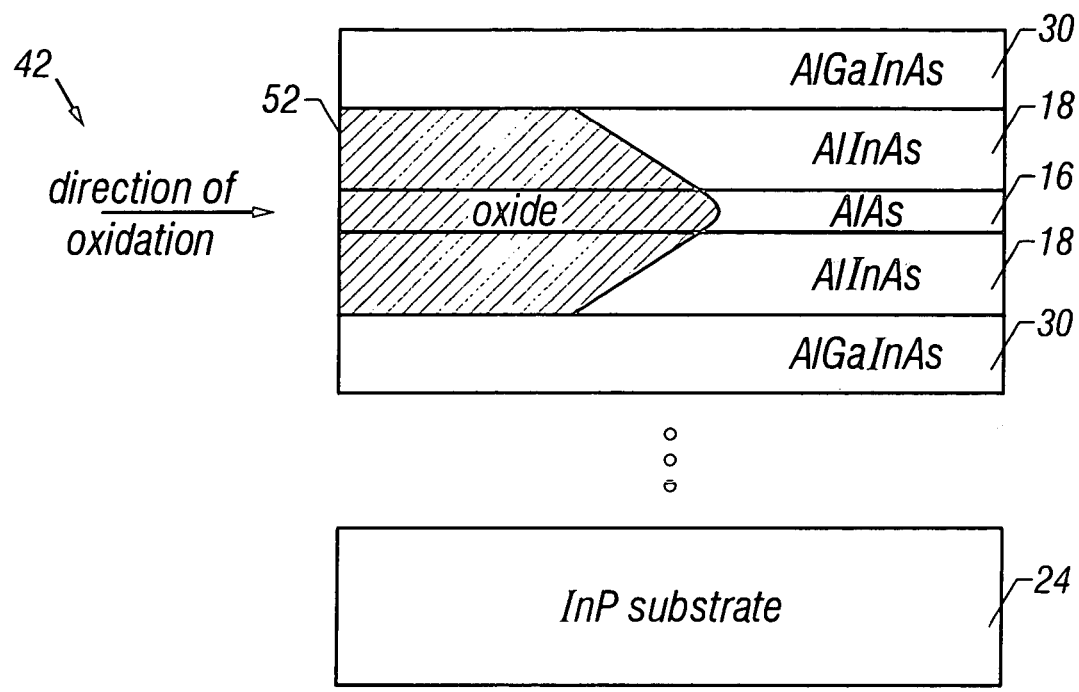
FIG. 4 illustrates an embodiment in which a faster-oxidizing layer is surrounded with slower-oxidizing layers.

FIG. 4 illustrates an embodiment in which the faster-oxidizing layer 16, such as AlAs, is surrounded with the slower-oxidizing layers 18, such as AlInAs. As shown, this embodiment can increase the overall thickness of the aperture, increase the oxidation rate, while implementing a symmetric tapered aperture 52. Again, the specific relative thicknesses serve only as an example and the usefulness of the invention is not limited to the thicknesses as illustrated.

Figure 5:
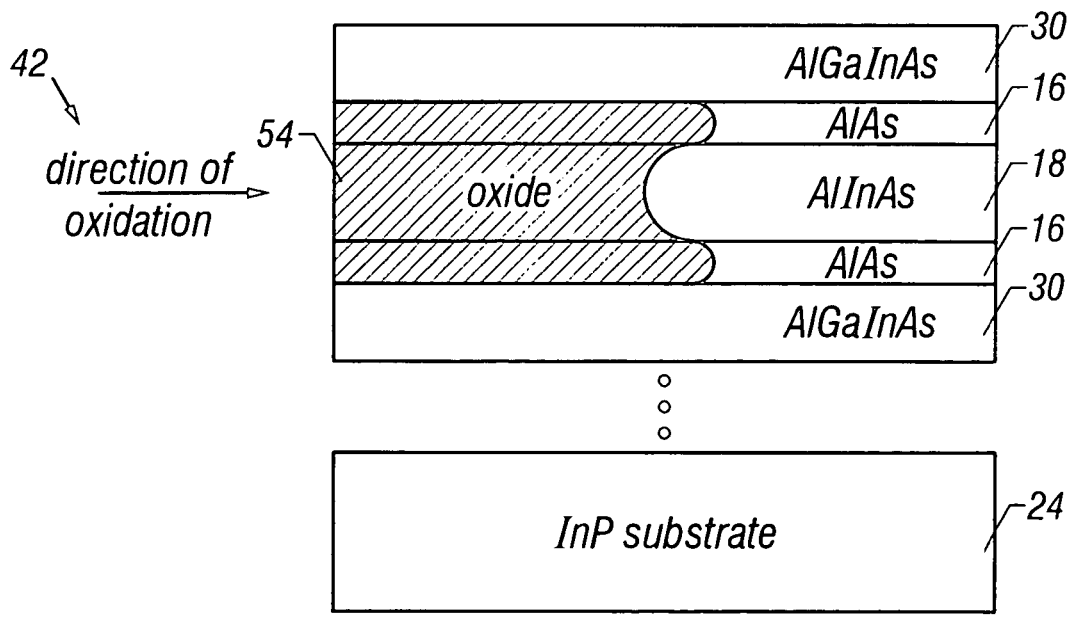
FIG. 5 illustrates an embodiment in which a slower-oxidizing layer is surrounded with faster-oxidizing layers.

FIG. 5 illustrates an embodiment in which the slower-oxidizing layer 18, such as AlInAs, is surrounded with the faster-oxidizing layers 16, such as AlAs, as shown below. As shown, this embodiment has the potential to increase the overall thickness of the aperture, increase the oxidation rate, while not implementing a tapered aperture 54. The slower-oxidizing layer is thus sandwiched between the two faster-oxidizing layers to form an symmetrically-untapered aperture. The specific relative thickness serve only as an example and the usefulness of the invention is not limited to the thickness as illustrated.

In other embodiments of those illustrated in FIGS. 3–5, the faster-oxidizing AlAs layers 16 can, rather than consisting of single layer AlAs, be replaced by two or more layers of AlAs separated by very thin layers of AlInAs. Thus, both the faster-oxidizing "layer" 16 as well as the slower-oxidizing layer 18 can be multiple layers.

The present invention can be used to aperture the semiconductor lasers described in the nonprovisional patent applications having the following attorney docket reference numerals which were all filed on Aug. 21, 2001 and all of which are hereby incorporated by reference in their entirety: 09/935,0099, 09/935,000 09/935,012, 09/934,789, 09/935,122, 09/935,352, 09/934,781, 09/935,279, and 09/934,791.

The present invention can be used with vertical-cavity surface-emitting semiconductor laser (VCSEL) for long wavelengths (i.e., 1.3 to 1.55 µm) to be used as optical sources for optical communication systems, optical interconnection, optical data-processing, or the like, in the field of optical data-communication or optical data-processing.

The present invention can be used to create an air or oxide aperture in the distributed Bragg reflectors, also known as DBRs or Bragg mirrors of the VCSEL, for example to confine the current to a desired area, reducing the device operating current. The optical mode is also confined, reducing optical loss and lowering the threshold current. The optical mode is confined by the aperture, resulting in reduced optical loss at the sidewall of the etched-pillar DBR, lower threshold current, lower threshold current density, larger differential quantum efficiency and higher output power. The tapering of the aperture can be very beneficial to a VCSEL design by providing an optical lens for focusing the light into the active region.

While the specification describes particular embodiments of the present invention, those of ordinary skill can devise variations of the present invention without departing from the inventive concept. For example the values for the strains of the layers can vary so long as there are alternating compressively and decompressively strained layers for reducing the overall strain of the structure. The exact relative quantities of the elements forming the materials of the layers can also vary. Also, the references to oxide apertures in the above description also apply to air apertures because etching is chemically related to the oxidation process and some etchants preferentially etch those materials that oxidize well. Also, the present invention can be used in many other applications other than VCSELs.

We claim:

1. A semiconductor structure comprising:
a III–V semiconductor substrate;
an aperture layer comprising at least one faster-oxidizing layer adjacent to at least one slower-oxidizing layer, wherein an air aperture is formed in the aperture layer, wherein the slower-oxidizing layer includes aluminum indium arsenide.

2. The semiconductor structure of claim 1, wherein the air aperture is formed by selectively etching out a portion of the aperture layer.

3. The semiconductor structure of claim 1, wherein the faster-oxidizing layer contains aluminum arsenide.

4. The semiconductor structure of claim 1, wherein the air aperture is tapered.

5. A semiconductor structure comprising:
an indium phosphide (InP) substrate; and
an aperture layer comprising at least one faster-oxidizing aluminum arsenide layer adjacent to at least one slower-oxidizing aluminum indium arsenide layer, wherein an air aperture is selectively etched from semiconductor material of the aperture layer.

6. A method for forming an aperture in a semiconductor comprising:
utilizing a III–V semiconductor substrate;
depositing at least one faster-oxidizing layer adjacent to at least one slower-oxidizing layer on a substrate;
forming the aperture to a desired shape by more quickly oxidizing the at least one faster-oxidizing layer than the at least one slower-oxidizing layer; and
selectively etching out the oxide to form an air aperture.

7. The method of claim 6, wherein the desired shape is an asymmetric taper.

8. The method of claim 6, wherein the desired shape is a symmetric taper.

9. The method of claim 6, wherein the desired shape is untapered.

10. The method of claim 6, wherein the substrate comprises InP.

11. The method of claim 10, wherein the air aperture is formed by selectively etching out the oxide.

12. The method of claim 10, wherein the faster-oxidizing layer contains aluminum arsenide.

13. The method of claim 10, wherein the slower-oxidizing layer includes aluminum indium arsenide.

14. A method for forming an aperture in a semiconductor comprising:
utilizing an indium phosphide (InP) substrate;
depositing at least one faster-oxidizing aluminum arsenide layer adjacent to at least one slower-oxidizing aluminum indium arsenide layer on a substrate;
forming the aperture to a desired shape by more quickly oxidizing the at least one faster-oxidizing layer than the at least one slower-oxidizing layer; and
selectively etching out the semiconductor from the faster-oxidizing layer and slower-oxidizing layer to form an air aperture.

15. A method for forming an aperture in a semiconductor comprising:
utilizing an indium phosphide (InP) substrate;
depositing at least one faster-oxidizing aluminum arsenide layer adjacent to at least one slower-oxidizing aluminum indium arsenide layer on a substrate;
forming the aperture to a desired shape by more quickly oxidizing the at least one faster-oxidizing layer than the at least one slower-oxidizing layer, wherein the desired shape is an asymmetric taper.

16. A semiconductor structure formed in a DBR of a VCSEL comprising:
alternating layers containing AlInAs and AlAs sandwiched between layers containing AlGaInAs;
a buffer layer;
an InP substrate wherein the buffer layer is sandwiched between the InP substrate and the alternating layers; and
an aperture formed in the alternating layers to form an aperture in the DBR of the VCSEL.

* * * * *